United States Patent [19]

Chi

[11] Patent Number: 4,908,772

[45] Date of Patent: Mar. 13, 1990

[54] INTEGRATED CIRCUITS WITH COMPONENT PLACEMENT BY RECTILINEAR PARTITIONING

[75] Inventor: Mely C. Chi, Murray Hill, N.J.

[73] Assignee: Bell Telephone Laboratories, Murray Hill, N.J.

[21] Appl. No.: 31,718

[22] Filed: Mar. 30, 1987

[51] Int. Cl.$^4$ ...................... G06F 15/60; G06F 15/20
[52] U.S. Cl. .................................... 364/491; 364/490; 364/489; 364/488
[58] Field of Search ............... 364/488, 489, 490, 491; 357/42

[56] References Cited

U.S. PATENT DOCUMENTS

| | | | |
|---|---|---|---|
| 3,617,714 | 11/1971 | Kernighan et al. | 364/300 |
| 4,554,625 | 11/1985 | Otten | 364/491 |
| 4,577,276 | 3/1986 | Dunlop et al. | 364/491 |
| 4,593,363 | 6/1986 | Burstein et al. | 364/491 |
| 4,630,219 | 12/1986 | DiGiacomo et al. | 364/491 |
| 4,700,317 | 10/1987 | Watanabe et al. | 364/488 |

OTHER PUBLICATIONS

"Rectilinear Area Routing: A Channel Router Approach", Hudson et al., IEEE, 1985, pp. 468-471.
"Min-Cut Placement" by Melvin A. Breuer, Design Automation & Fault Tolerant Computing, pp. 343-362, Oct. 1977.
"Chip Layout Optimization Using Critical Path Weighting" by A. E. Dunlop, 21st Design Automation Conference, IEEE 1984, pp. 133-136.
"A Placement Capability Based on Partitioning" by L. I. Corrigan, Proc. 16th Design Automation Workshop, IEEE 1979, pp. 406-413.
"Heuristic Improvement Technique for Bisection of VLSZ Networks", by M. K. Goldberg et al., International Conference on Computer Design, IEEE 1983.
"A Min-Cut Placement Algorithm for Centeral Cell Assemblies Based on a Graph Presentation" by Ulrich Lauther, Proc. 16th Design Automation Workshop, Jun. 1979, pp. 1-10.
"An Iterative Algorithm for Placement and Assignment of Integrated Circuits" by D. C. Schmidt et al., Proc. 12th Design Automation Workshop, 1975, pp. 361-368.

*Primary Examiner*—Parshotam S. Lall
*Assistant Examiner*—V. N. Trans
*Attorney, Agent, or Firm*—John P. McDonnell

[57] ABSTRACT

An integrated circuit, and a method for laying out and creating the integrated circuit, which contains large circuit blocks placed at any desired location on a chip, with the rest of the circuitry placed in the remaining non-rectangular area on the chip. The layout takes account of connections from within the circuit area to connection points external to the area. The procedure for the automatic layout proceeds in two steps. The first step is global partitioning and placement, and the second is detailed placement. The global partitioning performs the logical partitioning of the cells into clusters to be placed among and between the macro cells and the external terminals, with each cluster being eventually laid-out in a rectangular area. The second step involves the detailed placement of cells within the rectangular areas. Partitioning is accomplished by an iterative process, where at each iterative step the non-rectangular area is divided into two parts of approximately equal size. The circuitry to be placed in each of the divided areas is then partitioned in proportion to the size of the areas in accordance with known techniques, coupled with a novel terminal reassignment procedure.

5 Claims, 3 Drawing Sheets

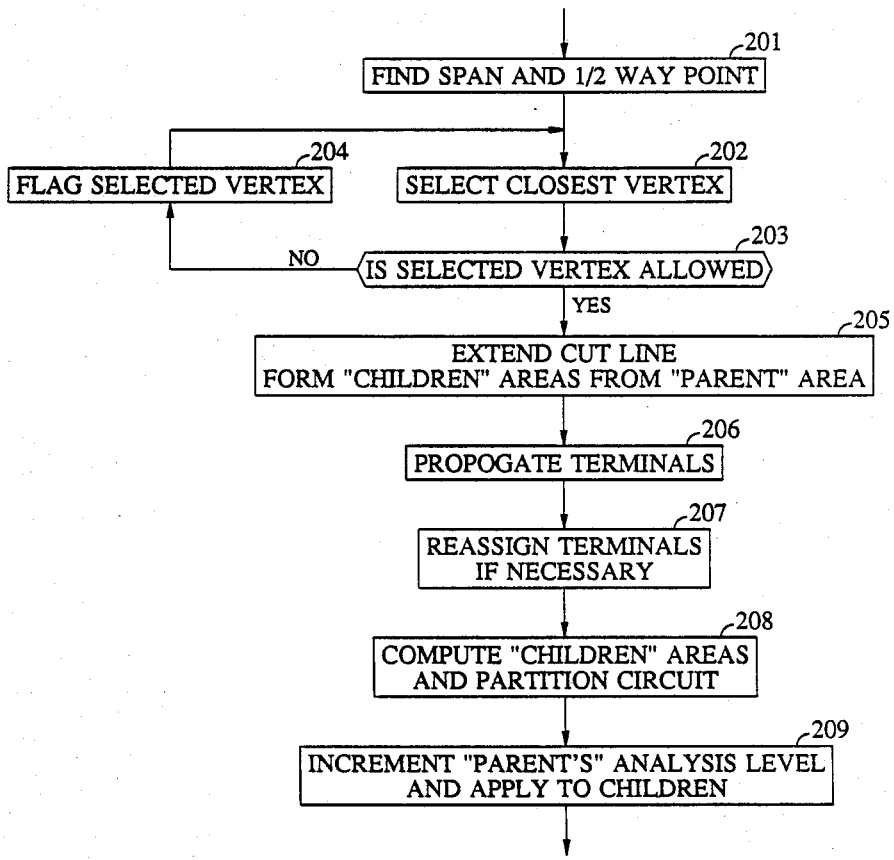

INTEGRATED CIRCUITS WITH COMPONENT PLACEMENT BY RECTILINEAR PARTITIONING

TECHNICAL FIELD

This invention relates to integrated circuit chip manufacture and to computer aided design of same. More particularly, this invention relates to the placement of circuit modules on integrated circuit chips to minimize the interconnection cost and to maximize the speed of operation.

BACKGROUND OF THE INVENTION

Integrated circuit technology has reduced the cost of electronic systems to the point where almost any member of the public can now, for example, own a computer that has capabilities which could have been found only in the largest industrial and military laboratories a short twenty years ago. The trend towards reduced size, reduced cost and the placement of more and more components on a single chip has continued unabated. VLSI (Very Large Scale Integration) is the current term used to describe such very dense integrated circuits. The present invention relates to the creation of VLSI circuits.

One of the major problems in the VLSI technology is the following: given the logical design of a circuit, how can the components and/or circuit modules be best positioned to minimize the unused areas and the areas devoted to the interconnections between the modules. The primary purpose of this minimization is to enable the placement of as many instances of the chip as possible on a single semiconductor wafer, thereby reducing fabrication costs. Alternatively, such minimization permits the placement of more computing power on a given chip size, and thereby also deriving performance and cost advantages. Another purpose is to reduce the path lengths in the circuit and the consequent delays and thus increase the speed of operation. One variant of this problem is the layout of a circuit made up of standardized circuit cells, or "polycells," which can be laid out in rows. Common signals such as power, ground and clocks are then routed through busses within the rows of cells. Terminals at the top and bottom of each cell are used to connect the cells to each other by conductive paths in the channels between the rows of cells. The use of polycells in designing the layout or a circuit offers the advantage of relatively fast turn-around time for the design.

One approach to the placement of circuit modules on an integrated circuit substrate was disclosed in U.S. Pat. No. 3,617,714, granted Nov. 2, 1971 to B. W. Kernighan and S. Lin, and assigned to applicant's assignee. In this patent, the modules and their interconnections are treated as the vertices and edges, respectively, of a graph. Optimum, or near optimum, partition of the vertices of the graph are obtained by creating an arbitrary partition and then iteratively exchanging pairs or groups of vertices to find a better partition, i.e., a partition with fewer inter-partition edges. Once partitioned, each subset is itself partitioned, and so forth, until the relative positions of all of the circuit modules are closely circumscribed. Various other techniques for identifying clusters (called partitioning, nested bisection, and min-cut placement) are described, for example, in the following references:

1. U. Lauther, "A Min-Cut Placement Algorithm for General Cell Assemblies Based on Graph Partitioning," *Proc. 16th Design Automation Workshop* (June, 1979);
2. M. Goldberg and M. Burstein, "Heuristic Improvement Technique for Bisection of VLSI Networks", *International Conference on Computer Design* (1983);
3. D. C. Schmidt and L. E. Druffel, "An Iterative Algorithm for Placement and Assignment of Integrated Circuits," *Proc. 12th Design Automation Workshop* (1975);
4. L. I. Corrigan, "A Placement Capability Based on Partitioning," *Proc. 16th Design Automation Workshop* (1979); and
5. M. A. Breuer, "Min-Cut Placement" *J. Design Automation & Fault Tolerant Computing* 1(4) pp. 343–362 (October, 1977).

Each of these techniques requires the logical interconnectivity of the circuit to be represented by a graph, with the components as nodes and the interconnections as edges.

The above-mentioned Kernighan-Lin technique can be used advantageously to identify clusters of circuit components or polycells that ought to be placed close to each other. Unfortunately, other constraints on the placement of circuit modules must also be observed in any real placement of modules on integrated circuit chips. One such major constraint is the placement of terminals and the other integrated circuit modules, i.e., connectivity constraints outside of the placement subarea. Obviously, a component layout which does not take such external module placement constraints into account will be subject to significant placement errors which either must be corrected or else suffer the resulting increase in interconnection lengths. Indeed, any scheme which attempts to modify an optimized placement after the placement is selected so as to account for constraints like the terminals of external module placement runs the risk of losing any advantage thereby gained.

Solution to this problem is disclosed in U.S. Pat. No. 4,577,276 granted Mar. 18, 1986 to A. E. Dunlop and B. W. Kernigham and assigned to applicant's assignee. In this patent, the positions of the external connections to an integrated circuit module are utilized at the beginning in selecting optimum or near optimum placements of modules on the integrated circuit substrate. Thereafter, on successive iterations, network connection terminals having position-sensitive placement constraints outside the placement area are likewise integrated into the placement strategy. This technique is called "terminal propagation," since the position of the "terminal" (outside placement constraint) "propagates" throughout the placement procedure, insuring a final placement which takes these outside placement constraints into account.

More particularly, the outside placement constraint is identified as an area boundary crossing whose position on the edge of the area reflects the outside constraint. The terminal propagation property is obtained by computing a rectilinear Steiner tree on the terminals outside the area being partitioned. The Steiner tree edges create the boundary crossings used for identifying the outside placement constraints. For most effective realization of the process, Dulop et al suggest the use of a programmed general purpose digital computer, and to that end they disclose a pseudocode for implementing the method.

The Dunlop et al disclosure permits an efficient placement of circuit elements that are position sensitive by the use of the terminal propagation technique, but the area that Dunlop et al consider for placing the circuit elements is rectangular. Alas, the chips to be designed quite commonly contain large circuit blocks, or macro cells, such as ROMs, RAMs, PLAs, etc., in addition to thousands of interconnected cells of "standard" or custom designs. Since the design and layout of such macro cells has been previously accomplished and honed to perfection (hopefully), it makes most sense to simply place the previously designed macro cells at convenient locations within the chip layout and then proceed with the layout of the remaining cells. However, when the macro cells are placed on the chip, the resulting available area is no longer rectangular. The natural thing to do (and prior art designs seem to bear this out), is to manually place the macro cells at the corners of the chip or close to one edge, so that the remaining available area is most compact and as close to being rectangular as possible. Thereafter, the remaining area is manually divided to form a set of rectangular areas and the circuitry is allocated to the divided portions. Detailed (and perhaps automatic) layout of the circuitry assigned to each of the divided subareas follows. Thus, typically, a circuit to be laid out is divided into macro cells and polycells. The polycells are manually divided into several groups using the designer's knowledge of the interconnectivity of the polycells, with the number of the groups being dependent on the number of rectangular areas that are left on the chip after manual placement of the macro cells. The number of polycells assigned to each group is estimated by the designer and then the polycells are placed within the floor plan using known placement methods. If the selected polycell division turns out a poor floor plan, then the process must be repeated. Indeed, even when the result is within the bounds of the available chip area, one does not know whether an optimum layout was achieved. What is even more disturbing is that presently macro cells are placed along the IC edges in order to reduce the layout burden, but such placement almost assures a non-optimum layout, because access to chip I/O pads is blocked by the macro cells.

No automated procedure seems to be available that permits both freedom in placement of the macro cells and optimized allocation of the remaining circuitry to the available non-rectangular area.

SUMMARY OF THE INVENTION

In accordance with the principles of the present invention, layout of integrated circuit cells proceeds automatically for chips containing big circuit blocks placed at any desired location on a chip, with the rest of the circuitry placed in the remaining non-rectangular area on the chip, while taking account of connections from within the area to connection points (e.g., terminals) external to the area. The procedure for the automatic layout proceeds in two steps. The first step is global partitioning and placement, and the second is detailed placement. The global partitioning performs the logical partitioning of the cells into clusters to be placed among and between the macro cells and the external terminals, with each cluster being eventually laid-out in a rectangular area. The second step involves the detailed placement of cells within the rectangular areas.

Partitioning may be accomplished by an iterative process. At each of the iterative steps, the non-rectangular area is divided into two parts of approximately equal size, with the division line starting at a corner of the area to be divided and proceeding in a direction that is either parallel or perpendicular to a border line that terminates at that corner. That division line terminates at a point of intersection with another border line. The circuitry to be placed is then partitioned in proportion to the size of the partitioned areas in accordance with known techniques, such as the min-cut technique of Kernighan et al and the terminal propagation technique of Dunlop et al. Terminal reassignment to account for unusual topographies is also employed.

BRIEF DESCRIPTION OF THE DRAWING

FIG. 5 elaborates on a portion of the FIG. 4 flowchart.

DETAILED DESCRIPTION

The creation of integrated circuits involves a number of steps, including functional design of the circuit, design of the standard or custom-tailored modules used to realize the functions, logical design of the overall circuit, placement of the standard and custom modules on the substrate, routing of conductors between the modules, preparation of masks, and fabrication.

Of these steps, the module placement step is possibly the most critical in maximizing the number of components that can be realized on a chip, the number of instances of a chip that can be realized on a semiconductor wafer, and the speed of operation of the overall circuit.

As described above, efforts to automate this process are continuing, and reference has been made to U.S. Pat. No. 3,617,714 which discloses a technique for minimizing the area of conductors interconnecting components in integrated circuit chips. Reference has also been made to the terminal propagation technique invented by A. E. Dunlop and B. W. Kernighan and disclosed in U.S. Pat. No. 4,577,276.

The present invention represents a significant step in the direction of automating the layout process for areas that are non-rectangular, by including an efficient process of global partitioning. Following the global partitioning, local partitioning is performed where the cells are divided into clusters to be placed among and between the macro cells and the external terminals, with each cluster being eventually laid-out in a rectangular area.

Figure 1:
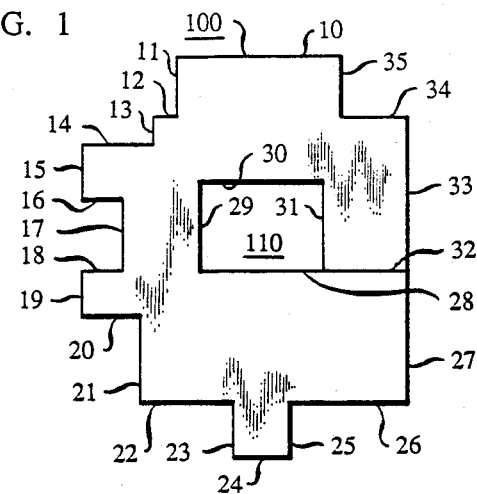
FIG. 1 depicts the layout area of an integrated circuit, with the layout areas of macro cells deleted.

FIG. 1 shows a possible arrangement of an integrated circuit chip where the area in which standardized (e.g., polycells) or custom designed integrated circuit cells may be placed is non-rectangular. Specifically, the area of cell placement, 100, is delineated by a rectilinear border comprising segments 10 through 35. In the illustration of FIG. 1, close to the center of area 100 there is an area 110 (encompassed by segments 28 through 31) which is excluded from area 100. Area 110, for example, may be devoted to the placement of a PLA which interacts only with the cells that are placed within area 100.

For that reason, it may have been deemed advantageous to place area 110 at the center of the chip.

It is the aim of the present invention to divide area 100 of FIG. 1 into rectangular subareas, and this division can be accomplished through horizontal cuts of area 100, through vertical cuts of area 100, or a combination of horizontal and vertical cuts. The choice of vertical cuts, horizontal cuts, or a combination thereof can be made either by the user or under program control. For purposes of this disclosure, however, only horizontal cuts are employed. Extension to vertical cuts and combination cuts can be easily implemented by persons skilled in the art. Also for the purposes of this disclosure, an iterative approach is described, although it may be realized by persons skilled in the art that similar results can be obtained with a non-iterative approach.

A careful study of FIG. 1 would reveal that each cut must start at a vertex of area 100 and, if possible, should terminate at another vertex of area 100. Proceeding from this observation, the first step is to identify the segments of FIG. 1 (and their relationships) and to locate a vertex that is nearest to the middle in the vertical dimension of the rectilinear area under consideration. The located vertex is then used as the starting point for the first cut line. Before the vertex locating procedure is described, however, it may be useful to make a number of observations.

First, each segment in the border defining the area available for laying out circuitry can be characterized as being a TOP, LEFT, BOTTOM, or RIGHT segment. This characterization can be derived by traversing the border in a selected direction and identifying segments of like traversal direction. For example, when moving counterclockwise with respect to the center of the layout area, segments traversed from right to left are TOP segments, segments traversed downward are LEFT segments, etc.

Second, the vertical coordinate of the end point of a vertical segment (RIGHT or LEFT) also corresponds to the vertical coordinate of a starting point of the next vertical segment, and to the vertical coordinate of both ends of an interposed horizontal segment (TOP or BOTTOM).

Third, the layout area may contain forbidden islands, such as area 110 in FIG. 1. Recognizing that each of the corners in such islands will eventually be points of cut lines, a cut line can arbitrarily be introduced into the specification of the available layout area. This results in a specification with coextensive segments, such as segment 32 and a portion of segment 28, but with no "islands". Introducing such a cut line permits one to traverse the entire border of the available layout area without "lifting the pencil". Although this traversal "rule" is not required in the final analysis, it simplifies the process of locating the cut-starting vertex.

Figure 2:
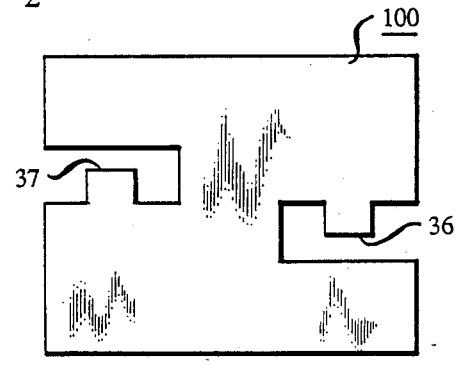
FIG. 2 illustrates an arrangement which includes vertices that may not serve as cut line vertices.

Fourth, a vertex should not be accepted as an originating point of a cut line when extension of the cut line in both directions traverses unavailable layout area. This is illustrated in FIG. 2 by segments 36 and 37, respectively. When specification of the layout area proceeds by identifying the border segments in a counter-clockwise direction, a forbidden "bottom of a well" condition (segment 36) can be recognized when the vertex under consideration belongs to a BOTTOM segment that is preceded by a LEFT segment and succeeded by a RIGHT segment. A forbidden "top of a pedestal" (segment 37) condition is recognized when the vertex under consideration belongs to a TOP segment that is preceded by a RIGHT segment and succeeded by a LEFT segment.

With the above in mind, my procedure for locating the cut-starting vertex is to: (1) classify each segment on the boundary as one of four types: a RIGHT, LEFT, TOP, or BOTTOM edge, corresponding to the direction of movement when traversing the boundary of area 100 in a preselected rotary direction; (2) sort the segments according to their classifications; (3) compute the vertical span of the layout area under consideration and find the half way point; and (4) select a vertex that is closest to the computed half way point but which does not correspond to a forbidden "bottom of a well" or a "top of a pedestal" position.

Having selected the starting vertex of the cut line, the next step is to extend the cut line in the required horizontal direction. E.g., when the vertex selected is the starting address of a LEFT segment, a cut line is extended to the right until it meets the first RIGHT segment whose starting location is lower than or equal to that of the selected vertex and whose ending location is higher than or equal to that of the selected vertex. When the extended cut line meets the opposite side at a vertex, the resultant two rectilinear subareas are easily constructed from the known vertices. When the extended cut line meets the opposite side at other than a vertex, another vertex (corresponding to the point of intersection) is created and the two resultant rectilinear subareas are constructed with the aid of the new vertex.

Once the subareas are defined, their areas are computed and the ratio of their areas is used in the circuit partioning step that follows.

Figure 3:
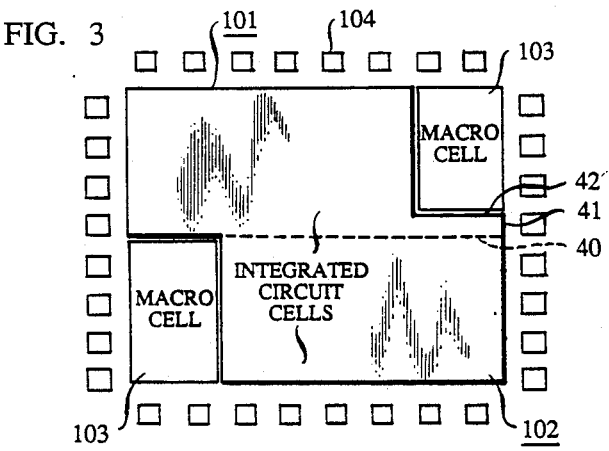
FIG. 3 illustrates an integrated circuit layout area with the surrounding terminals, and with a cut line that results in terminal reassignment.

The circuit partitioning step proceeds by accounting for the circuit connections to terminals external to each of the two subareas, and assigning portions of the circuit to be laid out in accordance with the external connection constraints. This follows the above-referenced Dunlop et al disclosure. The assignment of terminals to subareas is effected by computing a Steiner tree, in accordance with conventional techniques. A modification is introduced, however, to account for rectilinear structures that contain protrusions that are too narrow for even one row of cells. This condition, which is exemplified in FIG. 3, is ascertained by the existence of a BOTTOM and a TOP segment sequence (e.g., segment 40 and 42) with an interposed RIGHT or LEFT segment that is shorter than a preselected value (e.g., segment 41). When this condition exists, a terminal reassignment procedure is executed, whereby the terminal assignments indicated by the Steiner tree computations are reassigned to the other rectilinear subarea. In FIG. 3, for example, terminal assignments to segment 42 of area 101 are reassigned to segment 40 of area 102. As an aside, FIG. 3 also depicts the input/output terminals (104) surrounding the layout area which encompasses the integrated circuit cells (101 and 102) and the macro cells (103).

Once the terminals are assigned to each of the two rectilinear subareas, the location of some of the circuitry to be laid out is assigned, and a partitioning of the circuitry can proceed.

A number of partitioning procedures are available in the art as described above. I use the Kernighan-Lin technique, coupled with the assignment of heigher weights to critical signals, in accordance with the teachings of A. E. Dunlop and V. D. Agrawal, "Chip Layout Optimization Using Critical Path Weighting", 21st Design Automation Conference, *Proc. of the IEEE*, pp. 133-136, 1984. This step pulls the closely connected cells together while observing the topological and physical constraints.

Having separated the layout area into two rectilinear subareas, and having assigned circuit components to the two area, the process repeats for each of the subareas. That is, each of the subareas is divided roughly into two halves, the circuitry to be laid out in the subareas is partitioned and assigned to the halves, etc.

The process terminates for each of the developed subareas when the subarea is a rectangle. Eventually, all of the subareas degenerate to rectangles and the process halts. Thereupon, detailed layout of the polycells or the custom cells proceeds for each rectangular area in accordance with conventional techniques.

Figure 4:
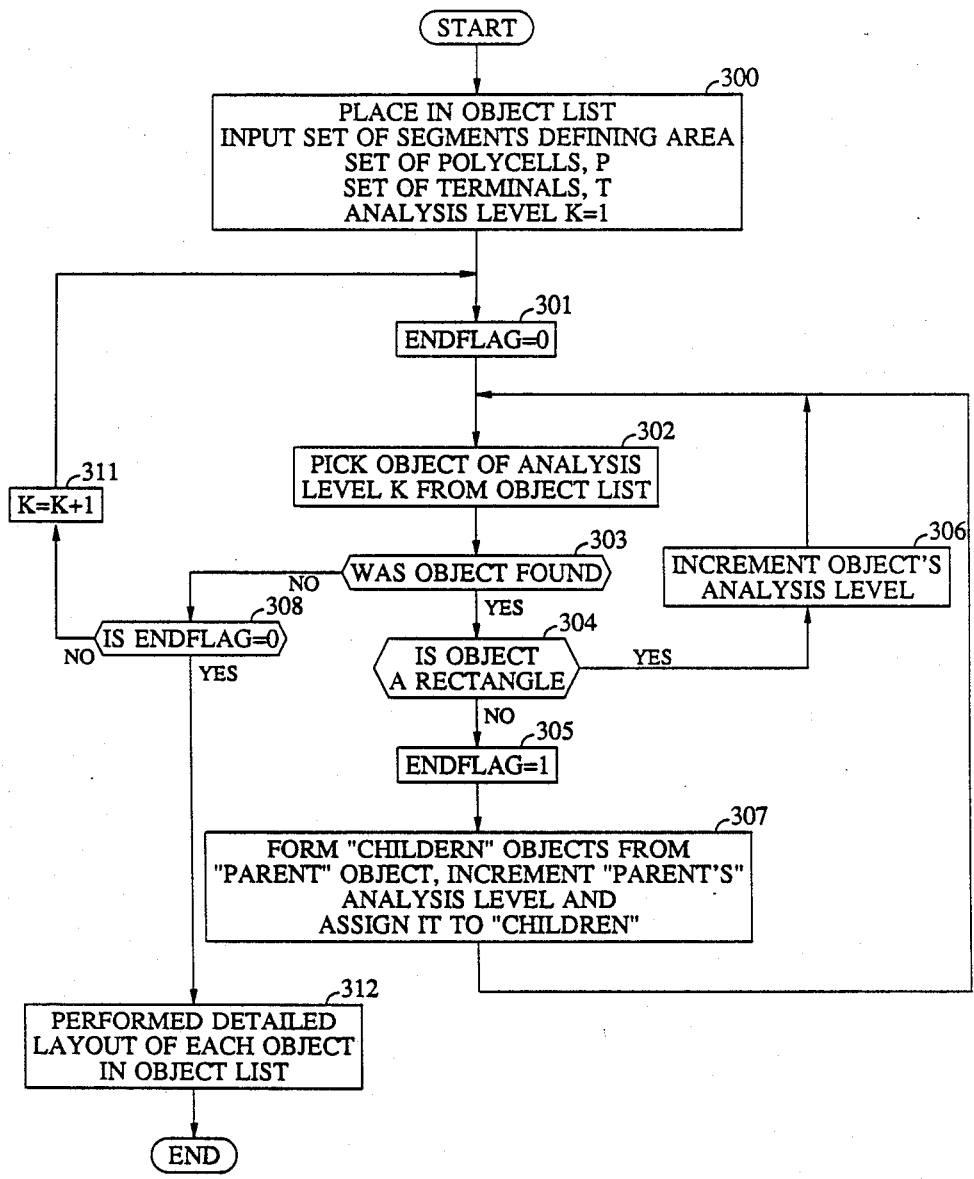
FIG. 4 is a flowchart of the layout and manufacturing process employing the principles of this invention.

FIG. 4 presents a flow chart of my process. In block 300 an Object List is created and populated, initially, with the given (one) object which defines the non-rectangular layout area. The object is defined, in connection with the layout area, by the set of segments which define the object; and, more particularly, by a header followed by a list that specifies the staring coordinate of a segment and a characterization of the segment. The header includes an "analysis level" flag, K. Thus, the object of FIG. 3, of example, may be specified by:

|       | Header,1 |        |
|-------|----------|--------|
| $X_1$, | $Y_1$   | B      |
| $X_2$, | $Y_1$   | R      |
| $X_2$, | $Y_2$   | T,etc. | where ($X_1$, $Y_1$ B) indicates that a BOTTOM segment begins at a location ($X_1$, $Y_1$) from the lower left-hand corner origin. It is followed by ($X_2$, $Y_1$ R) which indicates that the bottom segment is followed by a RIGHT segment that starts at coordinates ($X_2$, $Y_1$). It may be noted that the analysis level for the FIG. 3 object is initially set at 1, which means that the object is ready for a 1st iteration.

Following block 300, the process enters a loop, beginning with block 301, where ENDFLAG is set to zero. The value of ENDFLAG determines whether the iteration process is to continue or be terminated. Following block 301, the Object List is searched in block 302 for an object whose analysis level is K. The first object that is found is selected. In block 303 a decision is made based on whether a successful selection was made in block 302. When an object of level K is found and selected, control passes to block 304. Decision block 304 ascertains whether the selected object is a rectangle or not. If the object contains exactly four vertices, it is concluded that the object is a rectangle. The object's analysis level is incremented in block 306, and control returns to block 302. When it is concluded in block 304 that the object is not a rectangle, control passes to block 305 which sets ENDFLAG to 1, and then to block 307. Block 307 divides the area of the subject object (the "parent") into a number of subareas ("children"). The analysis level is incremented and attributed to each of the children objects, which are inserted in the object list in place of the parent object. Control then returns to 302.

Eventually, when no more objects of the current analysis level K are found in the Object List, control is passed by block 303 to block 308. Block 308 tests whether ENDFLAG=0. ENDFLAG does not equal zero whenever at one point of a particular analysis level an object was found (block 303) that was not a rectangle (block 304). Under those circumstances, control passed to block 311 where the analysis level, K, is incremented, and thereafter to block 301. When it is determined in block 308 that ENDFLAG does equal zero, it means that all objects in the object list are rectangles, and the division process terminates. At that point, block 312 performs the detailed layout, as described above, leading to the proper layout design.

FIG. 5 describes in greater detail the process of partitioning a "parent" object into "children" objects. Knowing the selected direction of partitioning, block 201 determines the span of the parent perpendicular to the cut, as well as the half way point. Ideally one would wish to partition the parent into two equal-sized children. Since the objective of the partitioning process is to divide the non-rectangular object into rectangles, the number of vertices must be reduced with each partitioning. Therefore, a cut line must always start at a vertex of the parent object. The half way point provides a rough measure of the location where the cut line should be found. That measure is employed in block 202 to find the vertex that is closest to the half way point.

As described above, under certain conditions a vertex should not be selected even when it is the closest vertex. Accordingly, decision block 203 determines whether the selected vertex is of the forbidden variety; and if it is, the vertex is flagged in block 204, and control is returned to block 202 where another vertex is selected. When the selected vertex is proper, block 205 extends the cut line in both directions, as permitted, to form the children areas. That is, a vertex connecting a horizontal segment with a LEFT segment may not be extended to the left, and correspondingly, a vertex connecting a horizontal segment with a RIGHT segment may not me extended to the right.

Extending the cut line may be accomplished with the following algorithm. With horizontal cuts, for example, a selected vertex is found an even number of times: as pairs of the Y-coordinate starting a horizontal segment, and as the Y-coordinate starting a vertical segment following the horizontal segment. A pair of vertices is chosen, and it may be noted that one vertex is, of course, to the right of the other. To extend the cut line in both direction, the left vertex is extended to the left till it meets a LEFT segment, and the right vertex is extended to the right till it meets a RIGHT segment. Meeting a RIGHT segment is determined by finding the nearest RIGHT segment which has one of the two properties: (1) the span of the RIGHT segment covers the Y-coordinate of the cut line, and (2) the starting or ending location of the RIGHT segment equals the Y-coordinate of the cut line. Meeting a LEFT segment is determined by a similar approach.

Having found the cut line segments, block 205 forms the children objects by traversing counter clockwise along the parent object until the cut vertex is encountered. At that point in the traversal, the cut segments are taken until a vertical segment is encountered. The traversal then continues to the point of origin, contiguous horizontal cut lines are combined, the resultant child is set aside and the segments (other than the cut lines) used to develop the child are deleted from the parent. Other children are formed from the remaining segments of the parent in the same manner, until all segments are accounted for.

Having extended the cut lines and partitioned the parent layout area into children sub-areas, control passes from block 205 to block 206, where terminal propagation is performed, as taught by Dunlop et al and referenced above. Thereafter, block 207 reassigns terminals, if necessary.

Once terminals are associated with a child, the area of the child is computed, the circuit associated with the parent is partitioned, as taught by Kernighan and Lin and referenced above. This is done in block 208.

Lastly, the analysis level of the parent is incremented and associated with the children in block 209.

Appendix A presents a pseudo-code describing, in a different manner the method of this invention, for implementing same on a general purpose computer. It is anticipated that any general purpose computer can be easily programmed with detailed code that follows the code presented in Appendix A, so that the process described above can be realized efficiently.

APPENDIX

The pseudocode of the rectilinear partitioning is summerized below. The "Main control procedure" provides the scope of the program flow. "rec_part" is the major routine which does the rectilinear partitioning.

Notation:
P = set of polycells
M = a module contains set of polycells P
B = a non-rectangle boundary of the module M
A = area of B
X = axis for partitioning direction
k = analysis level; this is the depth of the partitioning.
ENDFLAG = this control flag indicates if any more partitioning is required.

Main control procedure:

```
{
input data such as P,M,B
input partitioning axes or default directions may be assigned by the program
input parameters, such as number of iterations and resolutions for partitioning.
initialize analysis level k = 1
Repeat until ENDFLAG = 0
    {
    initialize partitioning requirement flag ENDFLAG = 0
    call recpartition(M,P,B,k) and it returns the value of ENDFLAG
    increment k = k+1
    }
do detailed partitioning of polycells in each subset;
place all polycells into rows;
terminate program
}
procedure recpartitioning(M,P,B,k)
{
Repeat until no more objects at level k
    {
    pick up next object Mi at level k
    if object Mi is a rectangle
        {
        assign level k' = k + 1 to object Mi
        }
    else
        {
        set ENDFLAG = 1
        call rec_part(M1,P1,Bi,Xi) to divide parent Mi into two rectilinear
            children Mj,Mk with boundary Bj,Bk respectively
        assign level k'=k+1 to children module Mj,Mk
        if k does not equal to 1, remove module Mi from hierarchy
        }
    }
return value of ENDFLAG
}
procedure rec_(part(M,P,B,axis)
{
check boundary B for correctness
define classification of segments (TOP,BOTTOM,LEFT,RIGHT)
build up tracing order relationship between segments
sort horizontal segments from low to high according to their y value.
sort vertical segments from low to high according to their x value.
use binary search to find middle segment whose extension might divide
    the rectilinear area into two approximately equal parts
call check_segment(middle_segment,B,axis) to check if extension of
    middle segment would divide boundary B
if middle segment can not be used as a division segment
    {
    search the next nearest segment until a division segment is found
    }
define the middle segment as a division segment
if partitioning axis is horizontal
    {
    if segment connected at low side of division segment is a RIGHT edge
        {
        call find_low_perp_segment(B,division_segment) to get target segment
            at low side of division segment and perpendicular to division segment
```

-continued

```
            create a new vertex at intersection of target segment and division line
            construct a counter clockwise rectilinear boundary Bj at high side
                of division line
            construct a counter clockwise rectilinear boundary Bk at low side of division line
            }
        else /* segment connected at low side of division segment is a LEFT edge */
            {
            call find_high_perp_segment(B,division_segment) to get target segment at
                high side of division segment that is perpendicular to division segment
            if target segment is found
                {
                create a new vertex at intersection of target segment and division line
                construct a counter clockwise rectilinear boundary Bj at
                    high side of division line
                construct a counter clockwise rectilinear boundary Bk at low
                    side of division line
                }
            else
                {
                find a target parallel segment at high side
                construct a counter clockwise rectilinear boundary Bj at high
                    side of division line
                construct a counter clockwise rectilinear boundary Bk at low
                    side of division line
                }
            }
        }
    else /* partitioning axis is vertical */
    {
    if segment connected at low side of division segment is a TOP edge
        {
        call find_low_perp_segment(B,division_segment) to get target segment at
            low side of division segment and it is perpendicular to division segment
        create a new vertex at intersection of target segment and division line
        construct a counter clockwise rectilinear boundary Bj at high side
            of division line
            construct a counter clockwise rectilinear boundary Bk at low side
            of division line
        }
    else /*segment connected at low side of division segment is a BOTTOM edge*/
        {
        call find_high_perp_segment(B,division_segment) to get target segment at
            high side of division segment and it is perpendicular to division segment
        if target segment is found
            {
            create a new vertex at intersection of target segment and division line
            construct a counter clockwise rectilinear boundary Bj at high
                side of division line
            construct a counter clockwise rectilinear boundary Bk at low
                side of division line
            }
        else
            {
            find a target parallel segment at high side
            construct a counter clockwise rectilinear boundary Bj at high
                side of division line
            construct a counter clockwise rectilinear boundary Bk at low
                side of division line
            }
        }
    }
construct pseudo modules Mj, Mk for the two subareas Bj, Bk
propagate_external_connections_to_Bj_Bk(Bj,Bk,axis)
calculate area Aj, Ak for Bj, Bk respectively
partition Pi into subset Pj, Pk to minimize inter connections between two subsets, where
    Pj = (Aj/Ai) * Pi
    Pk = (Ak/Ai) * Pi
}
procedure check_segment(middle_segment,B,axis)
{
if axis is horizontal
    {
    if segment connected at low side of middle segment is a LEFT edge, and
        segment connected at high side of middle segment is a RIGHT edge
        {
        middle segment is not a division segment
        }
    }
else
    {
    if segment connected at low side of middle segment is a BOTTOM edge, and
        segment connected at high side of middle segment is a TOP edge
```

```
        {
            middle segment is not a division segment
        }
    }
}
procedure find_low_perp_segment(B,division_segment)
{
find all segments which are perpendicular to division segment and located in
    low side of division segment
among these segments, find segments with spans covering division segments
choose one closest to division segment
}
procedure find_high_perp_segment(B,division_segment)
{
find all segments which are perpendicular to division segment and located in
    high side of division segment
among these segments, find segments with span covers division segments
choose one closest to division segment
}
procedure propagate_external_connections_to_B1_B2_(B1,B2)
{
for each net N connecting module in M to modules outside M
    {
        use Steiner tree for terminals on N
        compute intersections I of Steiner tree with M
        if there are no intersections
            {
                make one on closest side;
            }
        if I is located on boundary of B1
            {
                if I is located within a distance less than polycell height to division line
                    {
                        add one connection of N to B2,
                    }
                else
                    {
                        add one connection of N to B1;
                    }
            }
        if I is located on boundary of B2
            {
                if I is located within a distance less than polycell height to division line
                    {
                        add one connection of N to B1;
                    }
                else
                    {
                        add one connection of N to B2;
                    }
            }
    }
}
```

What is claimed is:

1. An integrated circuit having a predetermined area for placing components (FIG. 3 101, 102) and further having input/output terminals (FIG. 3 104), macro cells situated in said area (FIG. 3 103), and a plurality of interconnected integrated circuit cells situated in said area and connected to said macro cells and to said input/output terminals, where said integrated circuit is made in accordance with a process COMPRISING:

- a step of situating said macro cells on said area without regard to edges of said area;
- a step of iteratively, partitioning that portion of said area that is left after said situating of said macro cells, to develop a plurality of rectangular areas;
- a step of assigning said input/output terminals to specific ones of said plurality of rectangular areas;
- a step of allocating portions of said plurality of interconnected integrated circuit cells to each of said rectangular areas in proportion to the size of said rectangular areas, and accounting for said situating of said macro cells and said assigning of said input/output terminals; and
- a step of situating allocated portions of said integrated circuit cells in said rectangular areas.

2. A method for laying out integrated circuits comprising input ports, output ports, macro cells requiring rectilinear integrated circuit layout areas, and a plurality of integrated circuit cells within a predetermined area and in accordance with a procedure comprising the steps of:

placing said macro cells at chosen locations of said area without regard to the circumference of said area, thereby leaving a rectilinear area for laying out said plurality of integrated circuit cells;

successively dividing said rectilinear area of said integrated circuit cells into rectangular areas;

propagating connections from said input ports and said output ports to said rectangular areas;

successively partitioning said plurality of integrated circuit cells into sets assigned to said rectangular areas that account for the relative areas of said rectangular areas and for said step of propagating connections; and placing said integrated circuit cells assigned to each of said rectangular areas on said assigned areas.

3. A method for laying out integrated circuits comprising input ports, output ports, macro cells requiring rectilinear integrated circuit layout areas, and a plurality of integrated circuit cells within a predetermined area and in accordance with a procedure comprising the steps of:

placing said macro cells at chosen locations of said area without regard to the circumference of said area, thereby leaving a rectilinear area for laying out said plurality of integrated circuit cells;

dividing said rectilinear area of said integrated circuit cells into subareas with a cut line engulfing at least one vertex of said rectilinear area for laying out said integrated circuit cells;

propagating connections from said input ports and said output ports to edges of said subareas;

partitioning said plurality of integrated circuit cells into sets, equal in number to the number of said subareas and assigned to said subareas, with said partitioning accounting for the relative size of said subareas and for said step of propagating connections;

repeating said steps of dividing, propagating, and partitioning until all subareas are rectangular; and placing said integrated circuit cells assigned to each of said rectangular subareas on said assigned subareas.

4. The method of claim 3, further including a step interposed following said step of propagating connections, of reassigning terminal connections from an edge of a first subarea to an edge of second subarea when said step of propagating connections propagates terminals to said edge of said first subarea, and said edge is too close to another, parallel, edge of said first subarea to support the placement of integrated circuit cells between said edge and said other, parallel, edge.

5. The method of claim 3, wherein said cut line is consistently taken in a preselected direction parallel to one edge of said integrated circuit layout area.

* * * * *